United States Patent
Chen et al.

(10) Patent No.: US 12,389,777 B2
(45) Date of Patent: Aug. 12, 2025

(54) DISPLAY PANEL

(71) Applicant: Wuhan China Star Optoelectronics Semiconductor Display Technology Co., Ltd., Hubei (CN)

(72) Inventors: Zhuofan Chen, Hubei (CN); Haoran Wang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 540 days.

(21) Appl. No.: 17/899,676

(22) Filed: Aug. 31, 2022

(65) Prior Publication Data

US 2024/0049549 A1   Feb. 8, 2024

(30) Foreign Application Priority Data

Aug. 4, 2022   (CN) .......................... 202210933397.4

(51) Int. Cl.
*H01L 27/32* (2006.01)
*H10K 59/35* (2023.01)

(52) U.S. Cl.
CPC .................. *H10K 59/353* (2023.02)

(58) Field of Classification Search
CPC ... H10K 59/353; H10K 59/879; H10K 59/121
See application file for complete search history.

(56) References Cited

U.S. PATENT DOCUMENTS

2020/0203445 A1* 6/2020 Ou ..................... H10K 59/1213

FOREIGN PATENT DOCUMENTS

CN    113745298 A  * 12/2021   ........... H10D 86/411

\* cited by examiner

*Primary Examiner* — Elmito Breval

(57) ABSTRACT

The present application provides a display panel, including: a substrate; a light emitting layer disposed on one side of the substrate and including a plurality of sub-pixels; a first optical layer disposed on one side of the light emitting layer away from the substrate and including a plurality of openings disposed corresponding to the sub-pixels; a second optical layer disposed on one side of the first optical layer away from the substrate and filling the openings, the second optical layer having a larger refractive index than the first optical layer; in the first row of sub-pixels, first gaps between sub-pixels and openings corresponding thereto in a first direction are larger than second gaps in a second direction different from first direction; and in the second row of sub-pixels, third gaps between sub-pixels and openings corresponding thereto in the first direction are smaller than fourth gaps in the second direction.

19 Claims, 3 Drawing Sheets

DISPLAY PANEL

RELATED APPLICATION

This application claims the benefit of priority of Chinese Patent Application No. 202210933397.4 filed on Aug. 4, 2022, the contents of which are incorporated by reference as if fully set forth herein in their entirety.

TECHNICAL FIELD

The present application relates to a display technology field, and more particularly to a display panel.

BACKGROUND

An Organic Light Emitting Diode (OLED) is an organic thin film electroluminescent device. The OLED has the advantages of easy formation of a flexible structure, wide viewing angle, low voltage requirement, high power saving efficiency, fast response, light weight, thin thickness, simple structure, low cost, almost infinite high contrast, low power consumption, extremely high response speed, and the like, and thus has become one of the most important display technologies at present.

In order to improve the display light-emitting efficiency of an OLED display panel, reduce the power consumption of the OLED display panel, and prolong the life of the display panel, a light-concentrating structure is generally provided at the light-emerging side of sub-pixels of the display panel at present, so that light emitted from the sub-pixels is concentrated, thereby improving the output light intensity. However, a light-concentrating effect of the light-concentrating structure is related to an opening size of the light-concentrating structure and a size of a sub-pixel. When the opening size of the light-concentrating structure is closer to the size of the sub-pixel, the light-concentrating effect of the light-concentrating structure is best. As the opening size of the light-concentrating structure is increased or decreased, the light-concentrating effect of the light-concentrating structure is decreased, and the improvement of the light-emitting efficiency is gradually decreased until no effect is obtained.

At present, light-concentrating structures corresponding to sub-pixels of the same color have the same opening sizes and the same light path directions for light concentration, and an interference phenomenon easily occurs between light rays emitted from the sub-pixels of the same color to form color ribbon stripes, which affects the display effect of the display panel.

SUMMARY

It is an object of the present application to provide a display panel capable of solving problems such as presence of the interference phenomenon in a conventional display panel of forming color ribbon stripes to affect the display effect.

To solve the above problems, the present application provides a display panel, including: a substrate; a light emitting layer disposed on one side of the substrate and including a plurality of sub-pixels arranged in an array; a first optical layer disposed on one side of the light emitting layer away from the substrate and including a plurality of openings disposed corresponding to the sub-pixels; a second optical layer disposed on one side of the first optical layer away from the substrate and filling the openings, wherein the second optical layer has a larger refractive index than the first optical layer; wherein in the first row of sub-pixels, first gaps between the sub-pixels and the openings corresponding thereto in a first direction are larger than second gaps in a second direction which is different from the first direction; and in the second row of sub-pixels, third gaps between the sub-pixels and the openings corresponding thereto in the first direction are smaller than fourth gaps in the second direction.

Further, in the third row of sub-pixels, the first gaps between the sub-pixels and the openings corresponding thereto in the first direction are larger than the second gaps in the second direction; and the third row is disposed between the first row and the second row.

Further, in the fourth row of sub-pixels, the third gaps between the sub-pixels and the openings corresponding thereto in the first direction are smaller than the fourth gaps in the second direction; and the fourth row is disposed between the first row and the second row.

Further, the first gaps are equal to the fourth gaps, and the second gaps are equal to the third gaps.

Further, the sub-pixel includes first sub-pixels, second sub-pixels, and third sub-pixels which are different in color from each other. The openings include first openings disposed corresponding to the first sub-pixels, second openings disposed corresponding to the second sub-pixels, and third openings disposed corresponding to the third sub-pixels. In the first row of first sub-pixels, the first gaps between the first sub-pixels and the first openings corresponding thereto in the first direction are larger than the second gaps in the second direction. In the second row of first sub-pixels, the third gaps between the first sub-pixels and the first openings corresponding thereto in the first direction are smaller than the fourth gaps in the second direction.

Further, in the third row of first sub-pixels, the first gaps between the first sub-pixels and the first openings corresponding thereto in the first direction are larger than the second gaps in the second direction; and the third row is disposed between the first row and the second row.

Further, in the first row of second sub-pixels, the first gaps between the second sub-pixels and the second openings corresponding thereto in the first direction are larger than the second gaps in the second direction; and in the second row of second sub-pixels, the third gaps between the second sub-pixels and the second openings corresponding thereto in the first direction are smaller than the fourth gaps in the second direction.

Further, in the third row of second sub-pixels, the first gaps between the second sub-pixels and the second openings corresponding thereto in the first direction are larger than the second gap in the second direction; and the third row is disposed between the first row and the second row.

Further, in the first row of third sub-pixels, gaps between the third sub-pixels and third openings corresponding thereto in the first direction are equal to those in the second direction; and in the second row of third sub-pixels, gaps between the third sub-pixels and the third openings corresponding thereto in the first direction are equal to those in the second direction.

Further, each of the first sub-pixels is one of a red sub-pixel and a blue sub-pixel, each of the second sub-pixels is the other of the red sub-pixel and the blue sub-pixel, and each of the third sub-pixels is a green sub-pixel.

An advantage of the present application is that the first gaps in the first direction between the first row of sub-pixels and the openings corresponding thereto are larger than the second gaps in the second direction which is different from the first direction, and the third gaps in the first direction between the second row of sub-pixels and the openings corresponding thereto are smaller than the fourth gaps in the second direction, so as to change concentration directions of the first optical layer and the second optical layer corresponding to the first row of sub-pixels and the second row of sub-pixels, thereby preventing the display panel from generating color ribbon stripes due to occurrence of interference after the light rays of the first row of sub-pixels and the second row of sub-pixels are concentrated through the first optical layer and the second optical layer, and thus improving the display effect of the display panel.

According to the display panel of the present application, the first row of sub-pixels and the second row of sub-pixels are periodically changed, thereby improving the uniformity of light rays which are emitted by the first row of sub-pixels and the second row of sub-pixels and concentrated through the first optical layer and the second optical layer and thus improving the display uniformity of the display panel.

BRIEF DESCRIPTION OF THE DRAWINGS

In order to more clearly illustrate the technical solutions in embodiments of the present disclosure, the accompanying drawings depicted in the description of the embodiments will be briefly described below. It will be apparent that the accompanying drawings in the following description are merely some embodiments of the present disclosure, and other drawings may be obtained from these drawings without creative effort by those skilled in the art.

Figure 1:
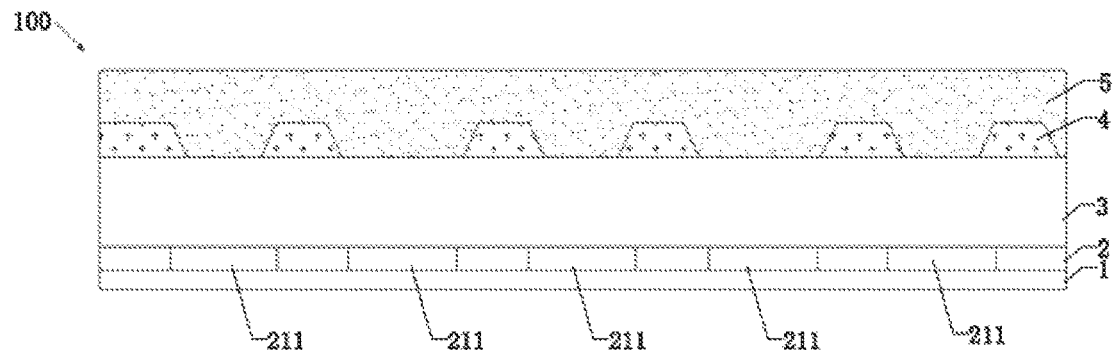
FIG. 1 is a structural diagram of first sub-pixels and first openings thereabove of a display panel in a first direction according to a first embodiment of the present application.

| Reference numerals: | |
|---|---|
| 100. display panel | 1. substrate |
| 2. light emitting layer | 3. encapsulation layer |
| 4. first optical layer | 5. second optical layer |
| 21. sub-pixel | 41. opening |
| 211. first sub-pixel | 212. second sub-pixel |
| 213. third sub-pixel | 411. first opening |
| 412. second opening | 413. third opening |
| 2111. first light ray | 2112. second light ray |
| 2113. third light ray | 2114. fourth light ray |

EMBODIMENTS OF THE PRESENT DISCLOSURE

The preferred embodiments of the present disclosure are described in detail following with reference to the accompanying drawings to fully introduce the summary of the present disclosure for those skilled in the art so as to certify the present disclosure can be implemented and render the disclosed technical content of the present disclosure clearer. Those skilled in the art will more readily understand how to implement the disclosure. However, the present disclosure may be embodied in different forms of embodiments, and the scope of the present disclosure is not limited to the embodiments described herein. The following description of the embodiments is not intended to limit the scope of the present disclosure.

The directional terms mentioned in the present disclosure, such as "upper", "lower", "front", "rear", "left", "right", "inside", "outside", "side", etc., only represent the directions in the drawings. The directional terms used herein are used to explain and illustrate the present disclosure and are not intended to limit the scope of the present disclosure.

In the drawings, structurally identical components are denoted by the same reference numerals, and structural or functionally similar components are denoted by similar reference numerals. Moreover, the size and thickness of each component shown in the drawings are arbitrarily shown for ease of understanding and description, and the present disclosure does not limit the size and thickness of each component.

Embodiment 1

As shown in FIG. 1, the present embodiment provides a display panel 100. The display panel 100 includes a substrate 1, a light emitting layer 2, an encapsulation layer 3, a first optical layer 4, and a second optical layer 5.

The material of the substrate 1 includes one or more of glass, polyimide, polycarbonate, polyethylene terephthalate, and polyethylene naphthalate, whereby the substrate 1 has a good impact resistance and can effectively protect the display panel 100.

Figure 2:
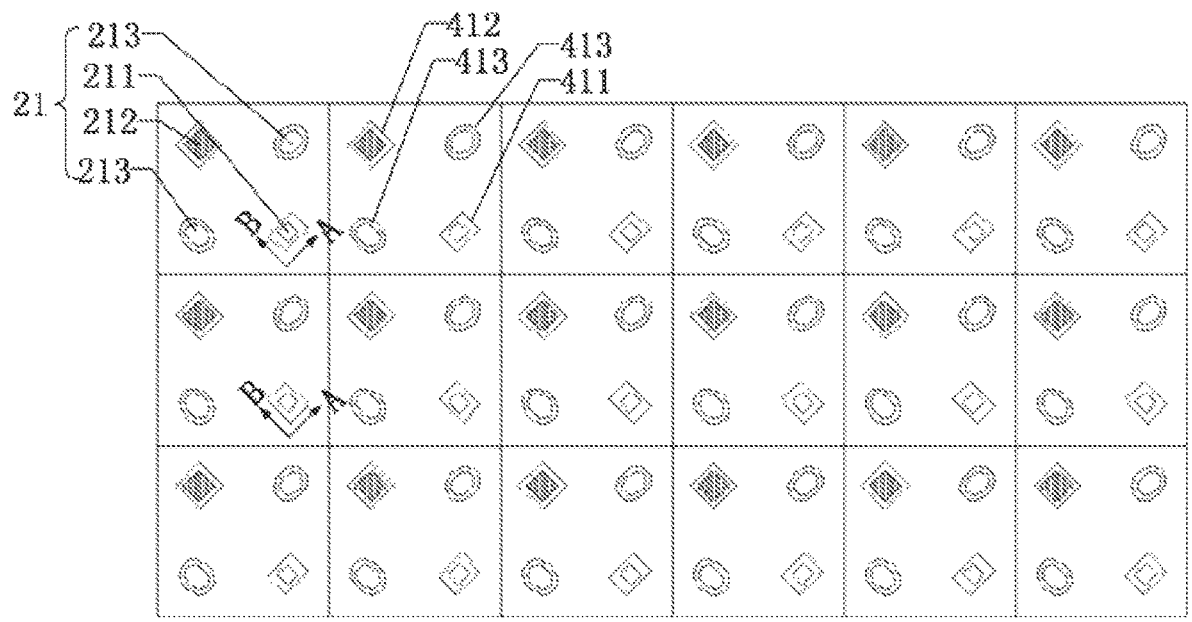
FIG. 2 is a top view of the display panel according to the first embodiment of the present application.

As shown in FIGS. 1 and 2, the light emitting layer 2 is disposed on one side of the substrate 1. The light emitting layer 2 includes a plurality of sub-pixels 21 arranged in an array. The sub-pixels 21 includes first sub-pixels 211, second sub-pixels 212, and third sub-pixels 213, which are different in color from each other.

Each of the first sub-pixels 211 is one of a red sub-pixel and a blue sub-pixel, each of the second sub-pixels 212 is the other of the red sub-pixel and the blue sub-pixel, and each of the third sub-pixels 213 is a green sub-pixel. In the embodiment, each of the first sub-pixels 211 is the red sub-pixel, each of the second sub-pixels 212 is the blue sub-pixel, and each of the third sub-pixels 213 is the green sub-pixel.

The shape of each of the first sub-pixels 211 is a centrosymmetrical pattern. The shape of each of the first sub-pixels 211 includes at least one of a parallelogram, a circle, and an ellipse. In the embodiment, the shape of each of the first sub-pixels 211 is a square. It should be noted that the shape of each of the first sub-pixels 211 herein refers to the shape of the projection pattern of a surface of one side of the first sub-pixel 211 close to the substrate 1 on the substrate 1.

The shape of each of the second sub-pixels 212 is a centrosymmetrical pattern. The shape of each of the second sub-pixels 212 includes at least one of a parallelogram, a circle, and an ellipse. In the embodiment, the shape of each of the second sub-pixels 212 is a square. Each of the second sub-pixels 212 has a larger side length than one of the first sub-pixels 211. It should be noted that the shape of each of the second sub-pixels 212 herein refers to the shape of the projection pattern of a surface of one side of the second sub-pixel 212 close to the substrate 1 on the substrate 1.

The shape of each of the third sub-pixels 213 is a centrosymmetrical pattern. The shape of each of the third sub-pixels 213 includes at least one of a parallelogram, a circle, and an ellipse. In the embodiment, each of the sub-pixels 21 includes two third sub-pixels 213, which are elliptical in shape. The long axes of the two third sub-pixels 213 are perpendicular to each other. It should be noted that the shape of each of the third sub-pixels 213 herein refers to the shape of the projection pattern of a surface of one side of the third sub-pixel 213 close to the substrate 1 on the substrate 1.

The encapsulation layer 3 is disposed on one side of the light emitting layer 2 away from the substrate 1. The encapsulation layer 3 is mainly used to prevent water and oxygen from intruding into the light emitting layer 2 and improve the service life of the display panel 100. Specifically, the encapsulation layer 3 may include a film layer structure such as a first inorganic layer, an organic layer, and a second inorganic layer.

The first optical layer 4 is disposed on one side of the encapsulation layer 3 away from the substrate 1. The refractive index of the first optical layer 4 ranges from 1.3-1.6. In the embodiment, the refractive index of the first optical layer 4 is 1.4. The material of the first optical layer 4 may be an organic material such as acrylic acid or epoxy resin, or may be an inorganic material such as $SiO_2$ or $SiO_N$.

The second optical layer 5 is covered on a surface at one side of the first optical layer 4 away from the substrate 1, and the second optical layer 5 has a larger refractive index than the first optical layer 4. The refractive index of the second optical layer 5 ranges from 1.5-1.9. In the embodiment, the refractive index of the second optical layer 5 is 1.7. The material of the second optical layer 5 may be an organic material doped with nanoparticles such as $ZrO_2$ and $TiO_2$, or may be an organic and inorganic mixed material such as a metal oxane.

The first optical layer 4 includes a plurality of openings 41 disposed corresponding to the sub-pixels 21. The second optical layer 5 is also filled within the openings 41. The shape of each of the openings 41 includes at least one of a parallelogram, a circle, and an ellipse.

Particularly, the openings 41 include first openings 411 disposed corresponding to the first sub-pixels 211, second openings 412 disposed corresponding to the second sub-pixels 212, and third openings 413 disposed corresponding to the third sub-pixels 213. The second optical layer 5 is also filled within the first openings 411, the second openings 412, and the third openings 413. In the embodiment, both the shape of each of the first openings 411 and the shape of each of the second openings are a rectangle.

The shape of each of the first openings 411 is a centrosymmetrical pattern. The center of each of the first openings 411 coincides with the center of one of the first sub-pixels 211. It should be noted that the shape of each of the first openings 411 herein refers to the shape of the projection pattern of a surface of one side of the opening 411 close to the substrate 1 on the substrate 1. Here, that the center of each of the first openings 411 coincides with the center of one of the first sub-pixels 211 means that the center of each of the first openings 411 coincides with the projection of the center of one of the first sub-pixels 211 on the substrate 1. The shape of each of the first openings 411 includes at least one of a parallelogram, a circle, and an ellipse. In the embodiment, the shape of each of the first openings 411 is a square.

The shape of each of the second openings 412 is a centrosymmetrical pattern. The center of each of the second openings 412 coincides with the center of one of the second sub-pixels 212. It should be noted that the shape of each of the second openings 412 herein refers to the shape of the projection pattern of a surface of one side of the second opening 412 close to the substrate 1 on the substrate 1. Here, that the center of each of the second openings 412 coincides with the center of one of the second sub-pixels 212 means that the center of each of the second openings 412 coincides with the projection of the center of one of the second sub-pixels 212 on the substrate 1. The shape of each of the second openings 412 includes at least one of a parallelogram, a circle, and an ellipse. In the embodiment, the shape of each of the second openings 412 is a rectangle.

The shape of each of the third openings 413 is a centrosymmetrical pattern. The center of each of the third openings 413 coincides with the center of one of the third sub-pixels 213. It should be noted that the shape of each of the third openings 413 herein refers to the shape of the projection pattern of a surface of one side of the third opening 413 close to the substrate 1 on the substrate 1. Here, that the center of each of the third openings 413 coincides with the center of one of the third sub-pixels 213 means that the center of each of the third openings 413 coincides with the projection of the center of one of the third sub-pixels 213 on the substrate 1. The shape of each of the third openings 413 includes at least one of a parallelogram, a circle, and an ellipse. In the embodiment, the shape of each of the third openings 413 is an elliptical shape.

In the first row of sub-pixel 21, first gaps between the sub-pixels 21 and the openings 41 corresponding thereto in a first direction A are larger than second gaps in a second direction B which is different from the first direction A. In the second row of sub-pixels 21, third gaps between the sub-pixels 21 and the openings 41 corresponding thereto in the first direction A are smaller than fourth gaps in the second direction B. As a result, it is possible to change concentration directions of the first optical layer 4 and the second optical layer 5 corresponding to the first row of sub-pixels 21 and the second row of sub-pixels 21, thereby preventing the display panel 100 from generating color ribbon stripes due to occurrence of interference after the light rays of the first row of sub-pixels 21 and the second row of sub-pixels 21 are concentrated through the first optical layer 4 and the second optical layer 5, and thus improving the display effect of the display panel 100.

In the embodiment, the first row of sub-pixels 21 and the second row of sub-pixels 21 are alternatively disposed and periodically changed, thereby improving the uniformity of light rays which are emitted by the first row of sub-pixels 21 and the second row of sub-pixels 21 and concentrated through the first optical layer 4 and the second optical layer 5 and thus improving the display uniformity of the display panel 100.

In the embodiment, the first direction A and the second direction B are perpendicular to each other, and in other embodiments, the first direction A and the second direction may be crossed but not perpendicular to each other. In the embodiment, the first gaps are equal to the fourth gaps, and the second gaps are equal to the third gaps.

In the embodiment, in the first row of first sub-pixels 211, the first gaps between the first sub-pixels 211 and the first openings 411 corresponding thereto in the first direction A are larger than the second gaps in the second direction B; and in the second row of first sub-pixels 211, the third gaps between the first sub-pixels 211 and the first openings 411 corresponding thereto in the first direction A are smaller than the fourth gaps in the second direction B. As a result, it is possible to change concentration directions of the first optical layer 4 and the second optical layer 5 corresponding to the first row of first sub-pixels 211 and the second row of first sub-pixels 211, thereby preventing the display panel 100 from generating color ribbon stripes due to occurrence of interference after the light rays of the first row of first sub-pixels 211 and the second row of first sub-pixels 211 are concentrated through the first optical layer 4 and the second optical layer 5, and thus improving the display effect of the display panel 100.

In the embodiment, in the first row of third sub-pixels 213, gaps between the third sub-pixels 213 and the third openings 413 corresponding thereto in the first direction A are equal to those in the second direction B; and in the second row of third sub-pixels 213, gaps between the third sub-pixels 213 and the third openings 413 corresponding thereto in the first direction A are equal to those in the second direction B.

Figure 3:
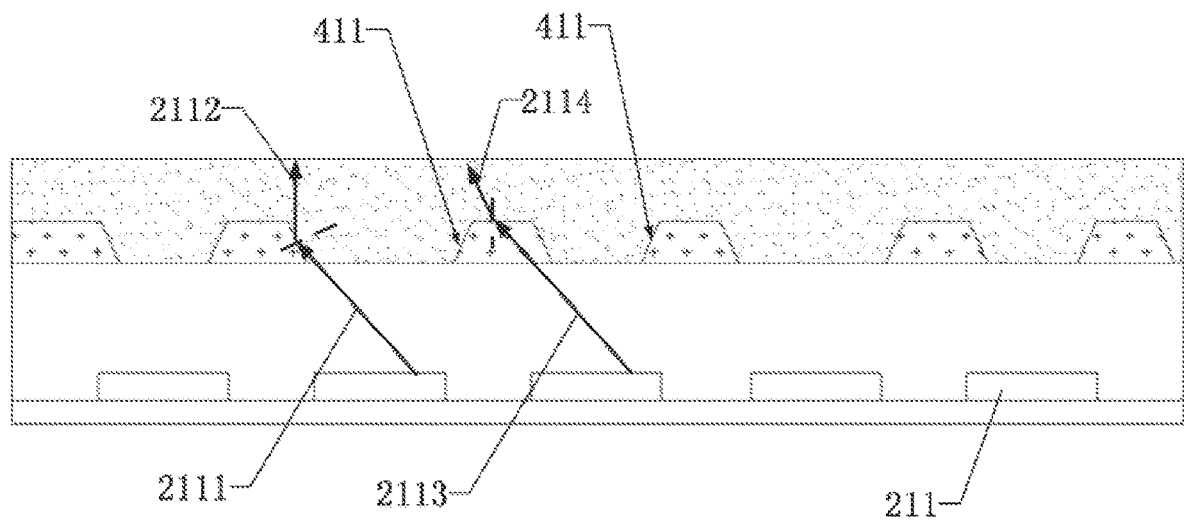
FIG. 3 is a schematic diagram of an optical path of the display panel according to the first embodiment of the present application.

As shown in FIG. 3, when the first light ray 2111 is irradiated to the first openings 411 corresponding to the first row of first sub-pixel 211, the first light ray 2111 is irradiated to the side wall of the first openings 411 to perform a total reflection so as to form the second light ray 2112. The third light ray 2113 parallel to the first light ray 2111 passes through the first optical layer 4 and is refracted at the interface between the first optical layer 4 and the second optical layer 5 to form a fourth light ray 2114. At this time, the second light ray 2112 is not parallel to the fourth light ray 2114. According to the embodiment of the present application, in the first row of sub-pixel 21, first gaps between the sub-pixels 21 and the openings 41 corresponding thereto in a first direction A are larger than second gaps in a second direction B which is different from the first direction A, and in the second row of sub-pixels 21, third gaps between the sub-pixels 21 and the openings 41 corresponding thereto in the first direction A are smaller than fourth gaps in the second direction B, so as to change concentration directions of the first optical layer 4 and the second optical layer 5 corresponding to the first row of first sub-pixels 211 and the second row of first sub-pixels 211, thereby preventing the display panel 100 from generating color ribbon stripes due to occurrence of interference after the light rays of the first row of first sub-pixels 211 and the second row of first sub-pixels 211 are concentrated through the first optical layer 4 and the second optical layer 5, and thus improving the display effect of the display panel 100.

Embodiment 2

Figure 4:
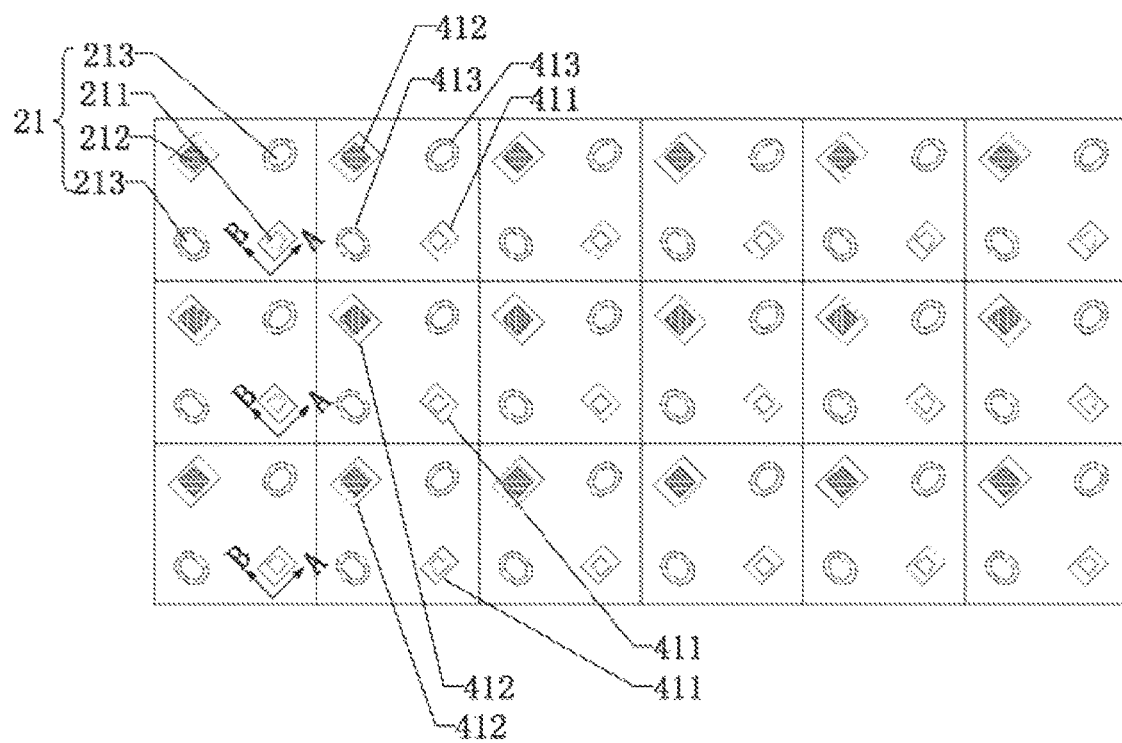
FIG. 4 is a top view of a display panel according to a second embodiment of the present application.

As shown in FIG. 4, the embodiment includes most of the technical features of Embodiment 1. The embodiment differs from Embodiment 1 in that, in the embodiment, in the first row of second sub-pixels 212, the first gap between the second sub-pixels 212 and the second openings 412 corresponding thereto in the first direction A are larger than the second gaps in the second direction B, and in the second row of the second sub-pixels 212, the third gaps between the second sub-pixels 212 and the second openings 412 corresponding thereto in the first direction A are smaller than the fourth gaps in the second direction B. As a result, it is possible to change concentration directions of the first optical layer 4 and the second optical layer 5 corresponding to the first row of second sub-pixels 212 and the second row of second sub-pixels 212, thereby preventing the display panel 100 from generating color ribbon stripes due to occurrence of interference after the light rays of the first row of second sub-pixels 212 and the second row of second sub-pixels 212 are concentrated through the first optical layer 4 and the second optical layer 5, and thus improving the display effect of the display panel 100.

Embodiment 3

Figure 5:
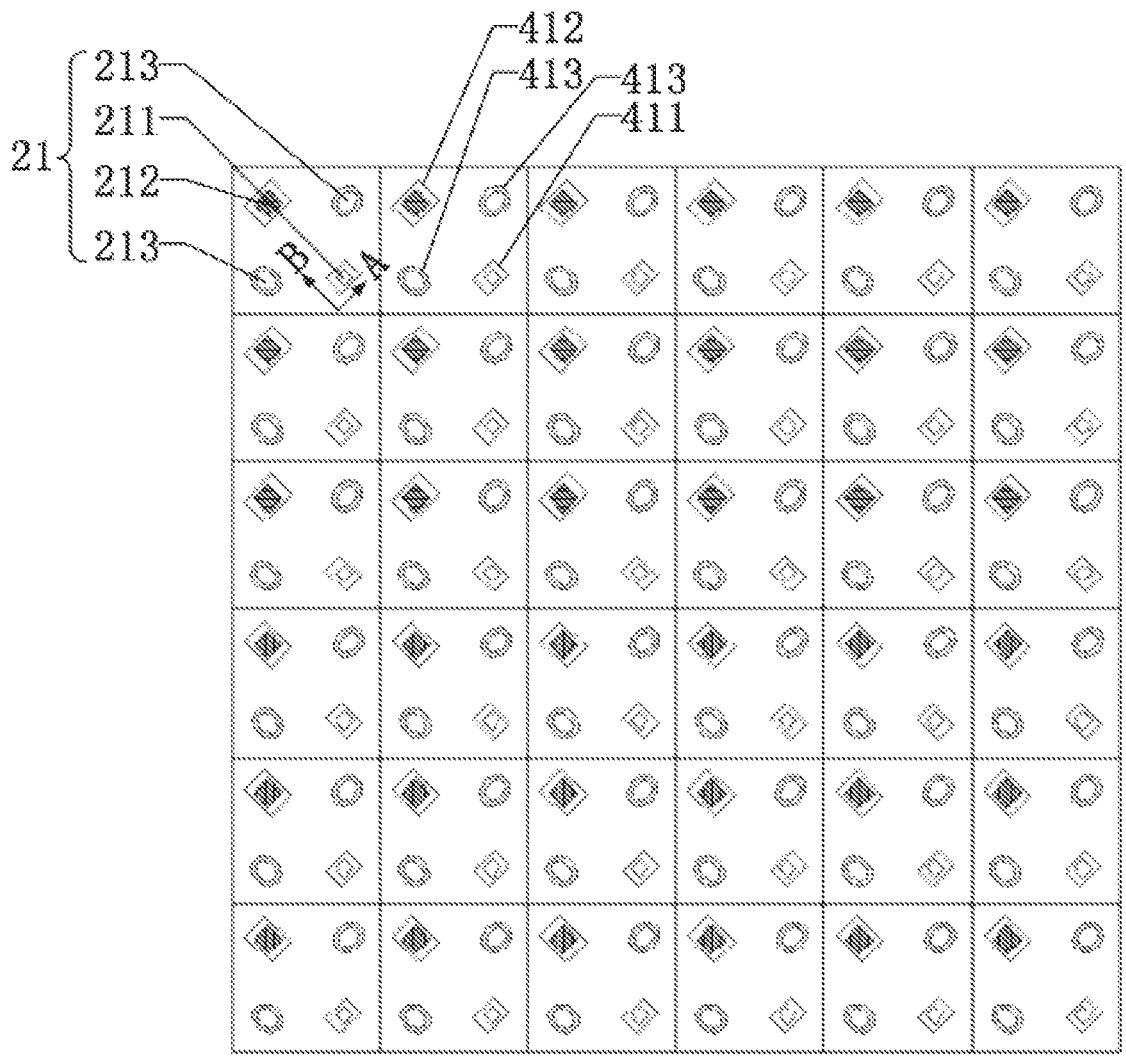
FIG. 5 is a top view of a display panel according to a third embodiment of the present application.

As shown in FIG. 5, the embodiment includes most of the technical features of Embodiment 2. The embodiment differs from Embodiment 2 in that, in the embodiment, in the third row of sub-pixels 21, the first gaps between the sub-pixels 21 and the openings 41 corresponding thereto in the first direction A are larger than the second gaps in the second direction B; and the third row is disposed between the first row and the second row. In the fourth row of sub-pixels 21, the third gaps between the sub-pixels 21 and the openings 41 corresponding thereto in the first direction A are smaller than the fourth gaps in the second direction B; and the fourth row is disposed between the first row and the second row.

Particularly, in the embodiment, in the third row of first sub-pixels 211, the first gaps between the first sub-pixels 211 and the first openings 411 corresponding thereto in the first direction A are larger than the second gaps in the second direction B; and the third row is disposed between the first row and the second row. The first openings 411 corresponding to the third row of first sub-pixel 211 are the same as the first opening 411 corresponding to the first row of first sub-pixel 211; in the fourth row of first sub-pixels 211, the first gaps between the first sub-pixels 211 and the first openings 411 corresponding thereto in the first direction A are larger than the second gaps in the second direction B; and the fourth row is disposed between the first row and the second row. The first openings 411 corresponding to the fourth row of first sub-pixel 211 are the same as the first opening 411 corresponding to the second row of first sub-pixel 211; every two of the first row of first sub-pixels 211 and every two of the second row of first sub-pixels 211 are alternately arranged, whereby the first row of first sub-pixels 211 and the second row of first sub-pixels 211 are alternatively disposed and periodically changed, thereby improving the uniformity of light rays which are emitted by the first row of first sub-pixels 211 and the second row of first sub-pixels 211 and concentrated through the first optical layer 4 and the second optical layer 5 and thus improving the display uniformity of the display panel 100.

Particularly, in the embodiment, in the third row of second sub-pixels 212, the first gaps between the second sub-pixels 212 and the second openings 412 corresponding thereto in the first direction A are larger than the second gap in the second direction B; and the third row is disposed between the first row and the second row. The second openings 412 corresponding to the third row of second sub-pixel 212 are the same as the second openings 412 corresponding to the first row of second sub-pixel 212. In the fourth row of second sub-pixels 212, the first gaps between the second sub-pixels 212 and the second openings 412 corresponding thereto in the first direction A are larger than the second gaps in the second direction B; and the fourth row is disposed between the first row and the second row. The second openings 412 corresponding to the fourth row of second sub-pixel 212 are the same as the second opening 412 corresponding to the second row of second sub-pixel 212; every three of the first row of second sub-pixels 212 and every three of the second row of second sub-pixels 212 are alternately arranged, whereby the first row of second sub-pixels 212 and the second row of second sub-pixels 212 are alternatively disposed and periodically changed, thereby improving the uniformity of light rays which are emitted by the first row of second sub-pixels 212 and the second row of second sub-pixels 212 and concentrated through the first optical layer 4 and the second optical layer 5 and thus improving the display uniformity of the display panel 100.

Further, the display panel provided in the present application are described in detail above. A specific example is used herein to describe a principle and an implementation of the present application. The description of the foregoing embodiments is merely used to help understand a method and a core idea of the present application. In addition, a person skilled in the art may make changes in a specific implementation manner and an application scope according to an idea of the present application. In conclusion, content of this specification should not be construed as a limitation on the present application.

What is claimed is:

1. A display panel, comprising:
a substrate;
a light emitting layer disposed on one side of the substrate and including a plurality of sub-pixels arranged in an array;
a first optical layer disposed on one side of the light emitting layer away from the substrate and including a plurality of openings disposed corresponding to the sub-pixels;
a second optical layer disposed on one side of the first optical layer away from the substrate and filling the openings, wherein the second optical layer has a larger refractive index than the first optical layer;
wherein in the first row of sub-pixels, first gaps between the sub-pixels and the openings corresponding thereto in a first direction are larger than second gaps in a second direction which is different from the first direction; and
in the second row of sub-pixels, third gaps between the sub-pixels and the openings corresponding thereto in the first direction are smaller than fourth gaps in the second direction.

2. The display panel of claim 1, wherein,
in the third row of sub-pixels, the first gaps between the sub-pixels and the openings corresponding thereto in the first direction are larger than the second gaps in the second direction; and
the third row is disposed between the first row and the second row.

3. The display panel of claim 1, wherein,
in the fourth row of sub-pixels, the third gaps between the sub-pixels and corresponding openings in the first direction are smaller than the fourth gaps in the second direction; and
the fourth row is disposed between the first row and the second row.

4. The display panel of claim 1, wherein the first gaps are equal to the fourth gaps, and the second gaps are equal to the third gaps.

5. The display panel of claim 1, wherein the sub-pixel includes first sub-pixels, second sub-pixels, and third sub-pixels which are different in color from each other;
the openings include first openings disposed corresponding to the first sub-pixels, second openings disposed corresponding to the second sub-pixels, and third openings disposed corresponding to the third sub-pixels;
in the first row of first sub-pixels, the first gaps between the first sub-pixels and the first openings corresponding thereto in the first direction are larger than the second gaps in the second direction; and
in the second row of first sub-pixels, the third gaps between the first sub-pixels and the first openings corresponding thereto in the first direction are smaller than the fourth gaps in the second direction.

6. The display panel of claim 5, wherein,
in the third row of first sub-pixels, the first gaps between the first sub-pixels and first openings corresponding thereto in the first direction are larger than the second gaps in the second direction; and
the third row is disposed between the first row and the second row.

7. The display panel of claim 6, wherein,
each of the first sub-pixels is one of a red sub-pixel and a blue sub-pixel, each of the second sub-pixels is the other of the red sub-pixel and the blue sub-pixel, and each of the third sub-pixels is a green sub-pixel.

8. The display panel of claim 6, wherein,
the shape of each of the first sub-pixels, the second sub-pixels, and the third sub-pixels is a centrosymmetric al pattern.

9. The display panel of claim 6, wherein,
the shape of each of the first sub-pixels, the second sub-pixels, and the third sub-pixels includes at least one of a parallelogram, a circle, and an ellipse.

10. The display panel of claim 6, wherein,
the shape of each of the first openings, the second openings, and the third openings is a centrosymmetrical pattern.

11. The display panel of claim 6, wherein,
the shape of each of the first openings, the second openings, and the third openings include at least one of a parallelogram, a circle, and an ellipse.

12. The display panel of claim 5, wherein, in the first row of second sub-pixels, the first gaps between the second sub-pixels and the second openings corresponding thereto in the first direction are larger than the second gaps in the second direction; and
in the second row of second sub-pixels, the third gaps between the second sub-pixels and the second openings corresponding thereto in the first direction are smaller than the fourth gaps in the second direction.

13. The display panel of claim 12, wherein,
in the third row of second sub-pixels, the first gaps between the second sub-pixels and the second openings corresponding thereto in the first direction are larger than the second gaps in the second direction; and
the third row is disposed between the first row and the second row.

14. The display panel of claim 13, wherein,
each of the first sub-pixels is one of a red sub-pixel and a blue sub-pixel, each of the second sub-pixels is the other of the red sub-pixel and the blue sub-pixel, and each of the third sub-pixels is a green sub-pixel.

15. The display panel of claim 12, wherein,
each of the first sub-pixels is one of a red sub-pixel and a blue sub-pixel, each of the second sub-pixels is the other of the red sub-pixel and the blue sub-pixel, and each of the third sub-pixels is a green sub-pixel.

16. The display panel of claim 5, wherein, in the first row of third sub-pixels, gaps between the third sub-pixels and the third openings corresponding thereto in the first direction are equal to those in the second direction; and
in the second row of third sub-pixels, gaps between the third sub-pixels and the third openings corresponding thereto in the first direction are equal to those in the second direction.

17. The display panel of claim 16, wherein,
each of the first sub-pixels is one of a red sub-pixel and a blue sub-pixel, each of the second sub-pixels is the other of the red sub-pixel and the blue sub-pixel, and each of the third sub-pixels is a green sub-pixel.

18. The display panel of claim 5, wherein,
each of the first sub-pixels is one of a red sub-pixel and a blue sub-pixel, each of the second sub-pixels is the other of the red sub-pixel and the blue sub-pixel, and each of the third sub-pixels is a green sub-pixel.

19. The display panel of claim 1, further comprising an encapsulation layer disposed on one side of the light emitting layer away from the substrate.

\* \* \* \* \*